United States Patent
Zhang

(10) Patent No.: US 9,818,930 B2
(45) Date of Patent: Nov. 14, 2017

(54) SIZE-CONTROLLABLE OPENING AND METHOD OF MAKING SAME

(71) Applicant: STMicroelectronics, Inc., Coppell, TX (US)

(72) Inventor: John Hongguang Zhang, Fishkill, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 47 days.

(21) Appl. No.: 14/938,432

(22) Filed: Nov. 11, 2015

(65) Prior Publication Data

US 2016/0064647 A1 Mar. 3, 2016

Related U.S. Application Data

(62) Division of application No. 13/645,658, filed on Oct. 5, 2012, now Pat. No. 9,214,622.

(60) Provisional application No. 61/547,862, filed on Oct. 17, 2011.

(51) Int. Cl.
*H01L 41/332* (2013.01)
*B23P 15/00* (2006.01)
*C03C 25/00* (2006.01)
*C23F 1/00* (2006.01)
*H01L 41/09* (2006.01)

(52) U.S. Cl.
CPC ........ *H01L 41/332* (2013.01); *H01L 41/0973* (2013.01)

(58) Field of Classification Search
CPC .................................................... H01L 41/332
See application file for complete search history.

(56) References Cited

U.S. PATENT DOCUMENTS

| | | | |
|---|---|---|---|
| 6,042,345 A | 3/2000 | Bishop et al. | |
| 7,582,490 B2 | 9/2009 | Golovchenko et al. | |
| 2002/0043895 A1 | 4/2002 | Richards et al. | |
| 2005/0074340 A1 | 4/2005 | Xu et al. | |
| 2005/0136682 A1* | 6/2005 | Hudson | H01L 21/31116 438/714 |
| 2005/0221019 A1* | 10/2005 | Baik | G03F 7/40 427/487 |
| 2007/0189702 A1 | 8/2007 | Arndt et al. | |
| 2007/0278663 A1* | 12/2007 | Bouche | B81B 7/0093 257/706 |
| 2008/0038467 A1* | 2/2008 | Jagannathan | B82Y 20/00 427/256 |

(Continued)

*Primary Examiner* — Thomas Pham
(74) *Attorney, Agent, or Firm* — Gardere Wynne Sewell LLP

(57) ABSTRACT

A support structure includes an internal cavity. An elastic membrane extends to divide the internal cavity into a first chamber and a second chamber. The elastic membrane includes a nanometric-sized pin hole extending there through to interconnect the first chamber to the second chamber. The elastic membrane is formed of a first electrode film and a second electrode film separated by a piezo insulating film. Electrical connection leads are provided to support application of a bias current to the first and second electrode films of the elastic membrane. In response to an applied bias current, the elastic membrane deforms by bending in a direction towards one of the first and second chambers so as to produce an increase in a diameter of the pin hole.

25 Claims, 8 Drawing Sheets

(56) References Cited

U.S. PATENT DOCUMENTS

2008/0160763 A1* 7/2008 Ban .................... H01L 21/0337
                                                         438/696
2012/0187546 A1* 7/2012 Akinmade-Yusuff ......................
                                                    H01L 21/31144
                                                         257/622

* cited by examiner

SIZE-CONTROLLABLE OPENING AND METHOD OF MAKING SAME

CROSS-REFERENCE TO RELATED APPLICATIONS

This application is a divisional application from U.S. application patent Ser. No. 13/645,658 filed Oct. 5, 2012, which claims priority from U.S. Provisional Patent Application No. 61/547,862 filed Oct. 17, 2011, the disclosures of which are hereby incorporated by reference.

TECHNICAL FIELD

The invention relates to nanometric structures and, in particular, to a nanometric or micrometric opening (such as a gap, hole or pore) having a controllable size.

BACKGROUND

The fabrication of features with micrometric and nanometric dimensions is well known in the art, for example in the semiconductor fabrication art and more specifically in connection with the making of micromechanical and microelectromechanical systems. Successful fabrication of such features is dependent on the ability of the fabrication process to repeatedly produce the features with consistent dimensions and very tight tolerances. The process typically takes advantage of high resolution lithography and high-precision additive and subtractive material processing techniques. U.S. Pat. No. 7,582,490, incorporated herein by reference, teaches a method for controlled fabrication of gaps in electrically conducting structures in a precise and repeatable manner.

The size of an opening is typically fixed by the fabrication process and cannot be modulated. There is a need in the art for a process suitable to manufacture an opening (such as a gap, hole or pore) whose size may be modulated in a controlled manner.

SUMMARY

According to an embodiment, a nanometric structure is provided having a nanometric opening (such as a gap or pore) whose size may be modulated in a controlled manner. This is accomplished by use of a controllable and changeable nanometric opening formed with two electrodes with a piezo material layer between the electrodes. By applying bias to the electrodes, the opening size and direction of the nanometric opening can be controlled.

According to an embodiment, an apparatus comprises: a support structure including an internal cavity within the support structure; and an elastic membrane extending to divide the internal cavity into a first chamber and a second chamber, the elastic membrane including a pin hole extending there through to interconnect the first chamber to the second chamber; wherein the elastic membrane includes a first electrode film and a second electrode film separated by an insulating film, said elastic membrane configured to respond to an application of bias current to the first and second electrode films by bending to increase a diameter of the pin hole.

According to an embodiment, a method comprises: forming an opening in a first substrate; filling the opening in the first substrate with a first etchable material; forming an elastic membrane including a first electrode film and a second electrode film separated by an insulating film to extend over the filled opening in the first substrate; forming a second substrate over the elastic membrane; forming an opening in the second substrate; filling the opening in the second substrate with a second etchable material; etching the second etchable material to expose a top surface of the elastic membrane; punching a pin hole through the elastic membrane; and removing the first and second etchable materials to define first and second chambers on either side of the elastic membrane.

According to an embodiment, an apparatus comprises: an elastic membrane extending to divide an internal cavity into a first chamber and a second chamber, the elastic membrane including a first electrode film and a second electrode film separated by an insulating piezo film and further including a pin hole extending through the elastic membrane to interconnect the first chamber to the second chamber; and electrical connection leads configured to apply a received bias current to the first and second electrode films, said elastic membrane configured to respond to the applied bias current by bending towards one of the first and second chambers so as to increase the diameter of the pin hole.

In an embodiment, a method comprises: forming an elastic membrane supported by a first substrate; forming a second substrate over the elastic membrane; forming an opening in the second substrate; filling the opening in the second substrate with an isotropically etchable material; etching the isotropically etchable material to form a mask opening that exposes a portion of a top surface of the elastic membrane; and using the mask opening to form a pin hole through the elastic membrane.

In an embodiment, a method comprises: forming a first opening in a first substrate; forming an elastic membrane including a first electrode film and a second electrode film separated by an insulating film to extend over the first opening in the first substrate; forming a second substrate over the elastic membrane; forming a second opening in the second substrate; and punching a pin hole through the elastic membrane.

BRIEF DESCRIPTION OF THE DRAWINGS

Other advantages and features of the invention will become clear on examining the detailed non-limiting description of methods of implementation and embodiments, and the appended drawings, in which.

DETAILED DESCRIPTION OF THE DRAWINGS

Figure 1:
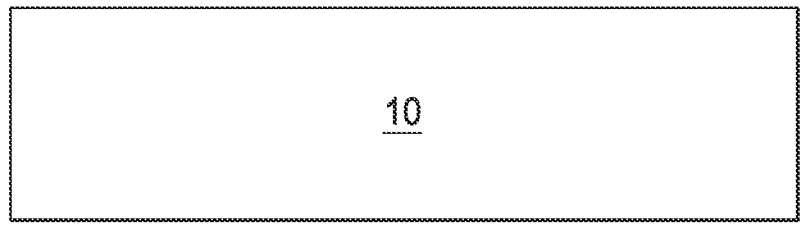
FIGS. 1-15 illustrate process steps for forming a nanometric structure having an opening (such as a gap, hole or pore) whose size may be modulated in a controlled manner.
Figure 2:
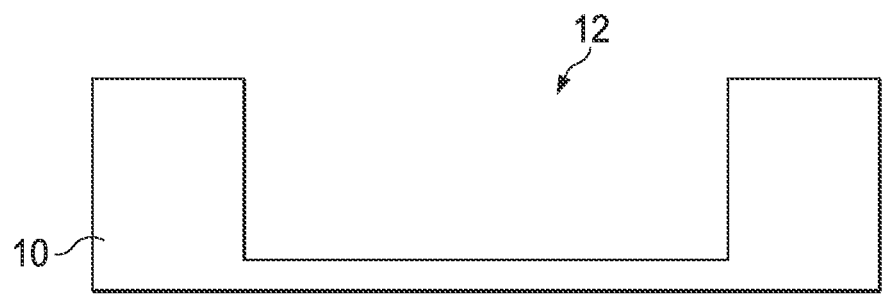
Figure 3:
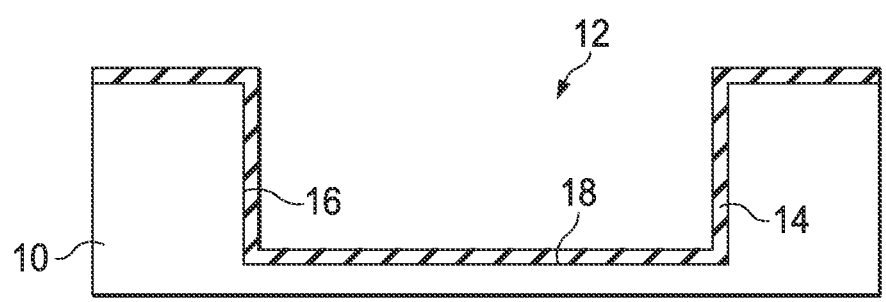
Figure 4:
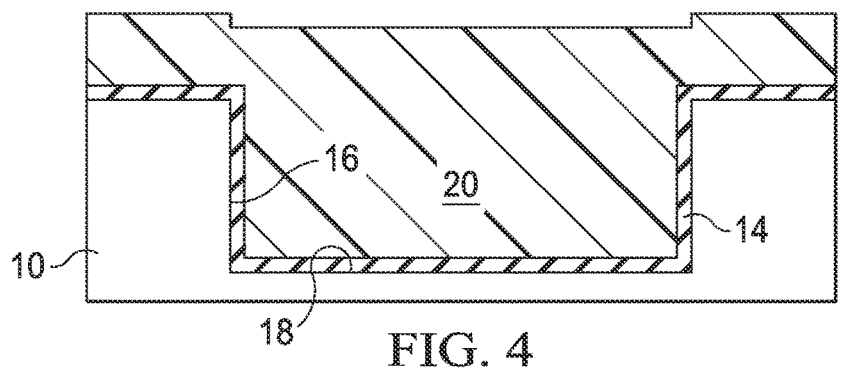
Figure 5:
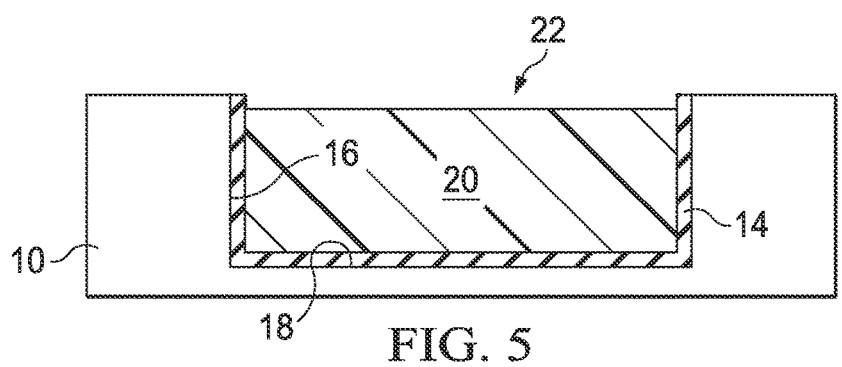
Figure 6:
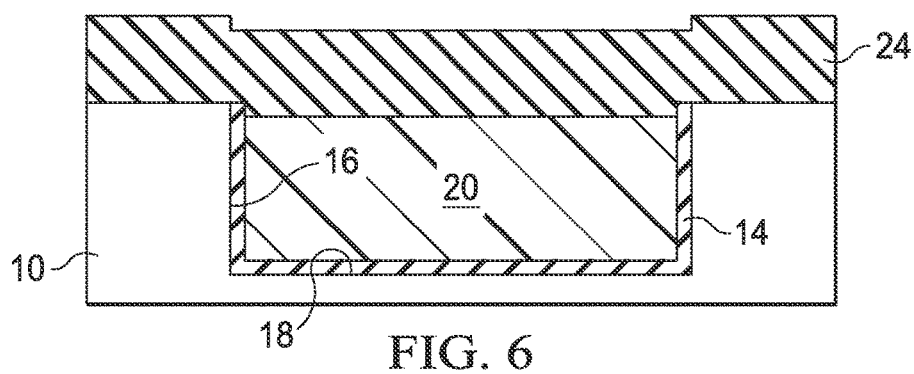
Figure 7:
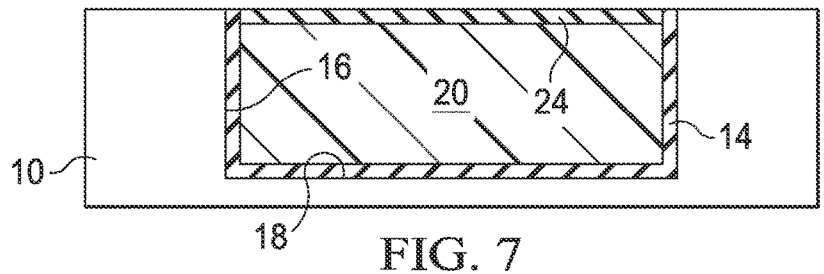

Reference is now made to FIGS. 1-15 which illustrate process steps for forming a nanometric structure having an opening (such as a gap, hole or pore, for example of nanometric or micrometric diameter) whose size may be modulated in a controlled manner. FIG. 1 illustrates a substrate 10 formed, for example, of silicon oxide. FIG. 2 illustrates the formation of an opening (cavity of a desired size and shape) 12 in the substrate 10 using any suitable process such as reactive ion etching (RIE). FIG. 3 illustrates the deposition of a protective liner 14 on the side walls 16 and bottom 18 of the opening 12 as well as the top surface of the substrate 10. The protective liner 14 may, for example, comprise silicon nitride. FIG. 4 illustrates the filling of the opening 12 with an etchable material 20. The etchable material may, for example, comprise a polymer material deposited using known spin-on processing techniques. The etchable material 20 is conformal in its deposit and will not only fill the opening 12 but also cover the top surface of the substrate 10 and protective liner 14. FIG. 5 illustrates the removal of excess (i.e., unwanted) etchable material 20 that is not located within the opening 12 and thus expose the top surface of the substrate 10. The removal may be accomplished using any suitable process such as reactive ion etching (RIE). With respect to etching, the protective liner 14 functions as an etch stop indicator. It will be noted that removal shown in FIG. 5 will remove a portion of the etchable material 20 located within the opening 12 (as shown at reference 22), but will substantially leave the protective liner 14 along the side walls 16. FIG. 6 illustrates the deposition of a second protective liner 24 on the top surface of the substrate 10 and the top surface of the etchable material 20 so as to fill the opening 22. The protective liner 24 may, for example, comprise silicon nitride (similar to the liner 14). FIG. 7 illustrates the removal of excess (i.e., unwanted) second protective liner 24 that is not located on the top surface of the etchable material 20. The removal may be accomplished using any suitable process such as chemical mechanical polishing (CMP). The result is an etchable material 20 portion surrounded by the material of the first and second protective liners 14 and 24, and supported within the opening 12 in the substrate 10.

Figure 8:
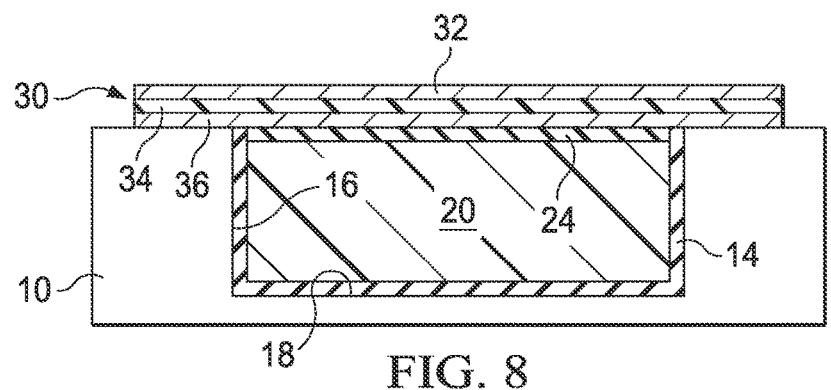

FIG. 8 illustrates the deposit of a film stack 30 including a bottom electrode film 32, and insulating film 34 and a top electrode film 36. The film stack 30 is provided in contact with the top surface of the substrate 10 on either side of the opening and is further in contact with the top surface of the surrounding protective liner 24. The electrode films 32 and 36 are electrically conductive and made of an electrically conductive material such as Pt, and may further each be made of a multilayer structure, for example, of Ti/TiO$_2$/Pt. The insulating film 34 may be a piezo material such as PZT. An REI process may be used to pattern the film stack 30 into a desired configuration.

Figure 9:
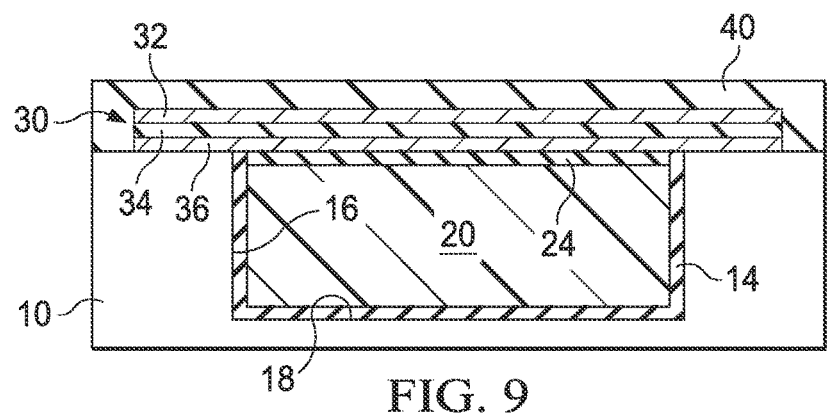

FIG. 9 illustrates the deposition of an encapsulating material 40 that encapsulates the film stack 30. The encapsulating material may, for example, comprise a silicon nitride protective layer in combination with Nblock. The Nblock may function as a sacrificial stop layer during a later removal process.

Figure 10:
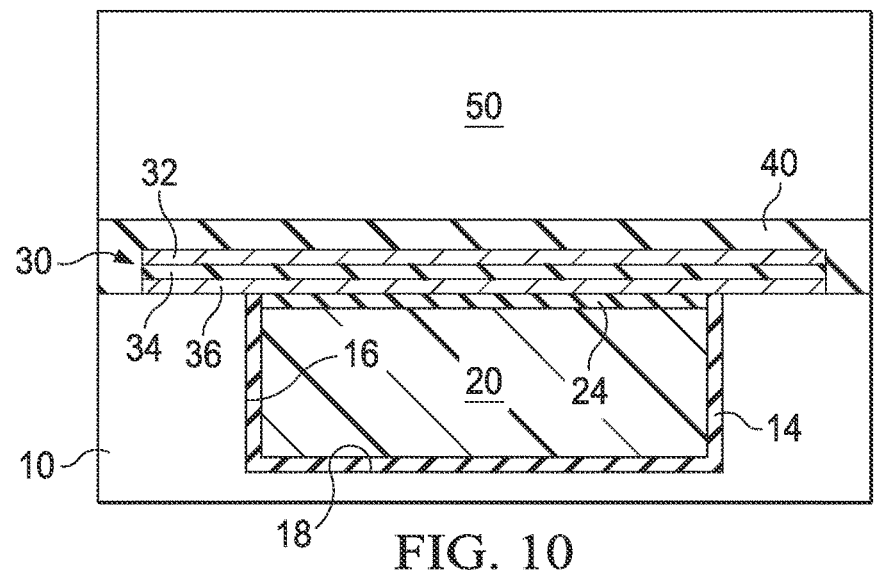
Figure 11:
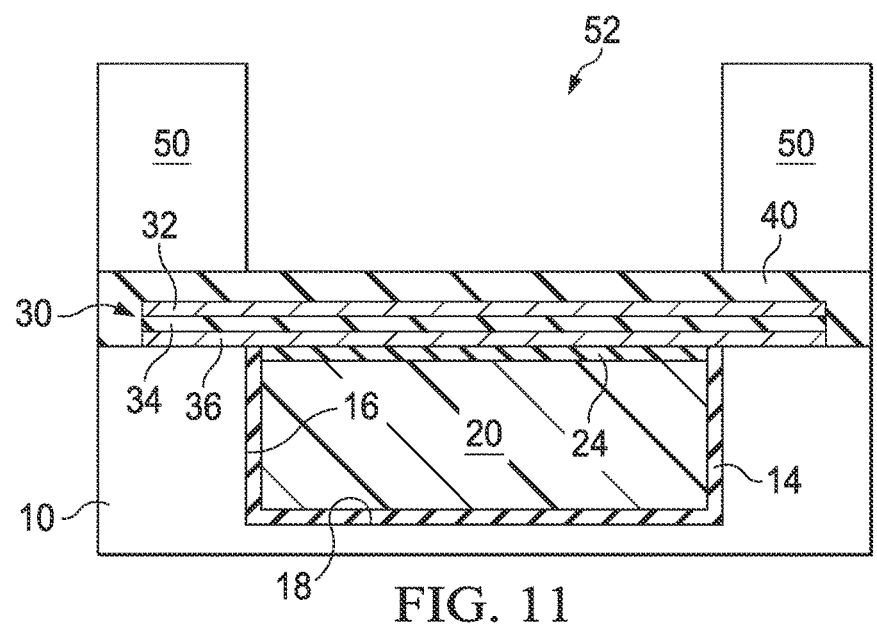
Figure 12:
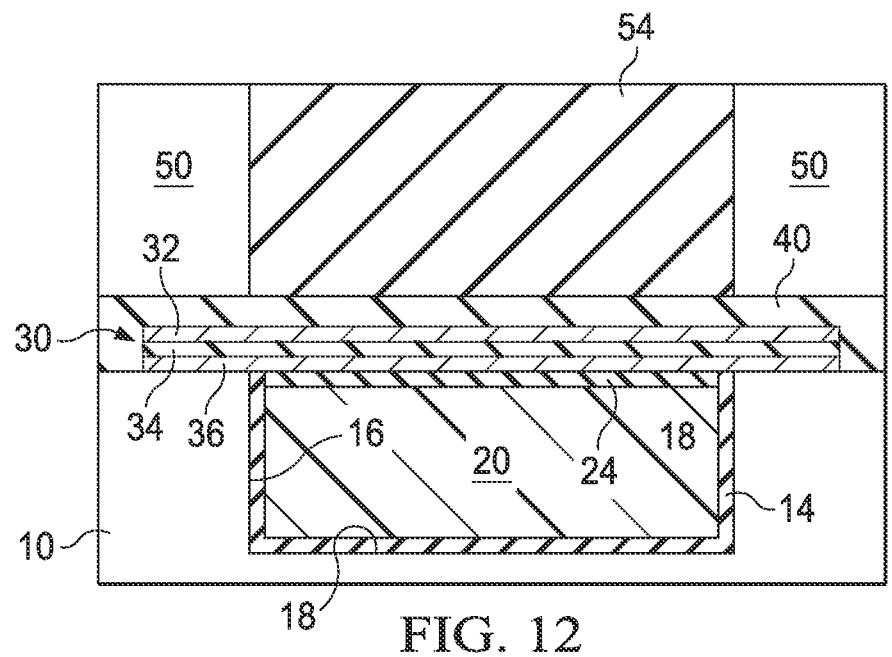

FIG. 10 illustrates a second substrate 50 formed, for example, of silicon oxide deposited on the encapsulating material 40. FIG. 11 illustrates the formation of an opening (cavity having a desired size and shape) 52 in the second substrate 50 using any suitable process such as reactive ion etching (RIE). FIG. 12 illustrates the filling of the opening 52 with an etchable material 54. The etchable material is preferably selected to exhibit good isotropic etch characteristics. An example of such a material is silicon nitride. The etchable material 50 is conformal in its deposit and will not only fill the opening 52 but also cover the top surface of the substrate 50. FIG. 12 further illustrates that excess (i.e., unwanted) etchable material 50 that is not located within the opening 52 has been removed to thus expose the top surface of the substrate 50. The removal may be accomplished using any suitable process such as chemical mechanical polishing (CMP).

Figure 13:
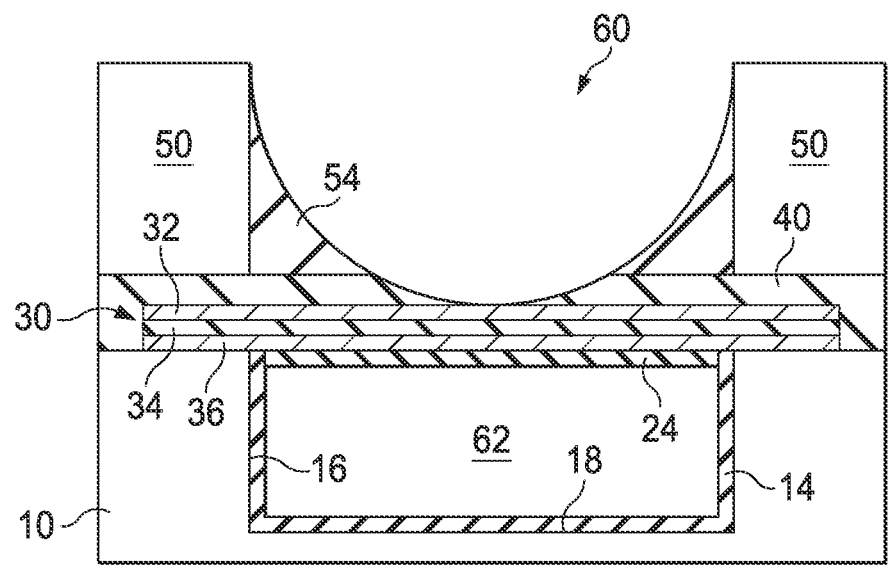

FIG. 13 illustrates the performance of an isotropic etch on the etchable material 50 to open a portion of a top chamber 60 in the etchable material 50 that reaches to the top surface of the film stack 30. Because the etch is isotropic, a small portion of the top surface of the film stack 30 is exposed at or near the center of the film stack 30. FIG. 13 further illustrates the performance of an RIE on the etchable material 20 to open a bottom chamber 62 in the etchable material 20. The etching operations to open the top and bottom chambers may be performed in any selected order.

Figure 14:
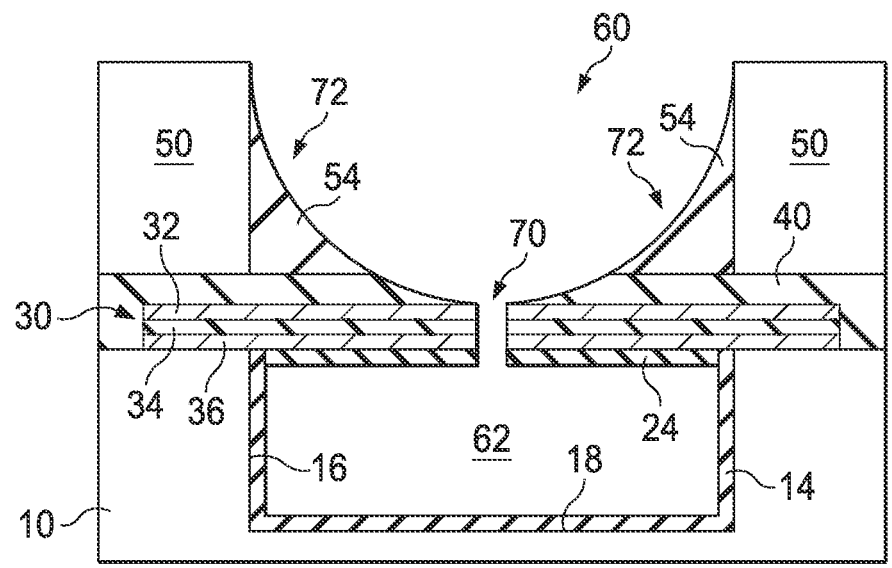

FIG. 14 illustrates the formation of a pin hole 70 extending through the film stack 30 and protective liner 24 so as to connect the top chamber 60 to the bottom chamber 62. The pin hole 70 has a desired size (diameter d1, which in a preferred implementation is nanometric) and is preferably formed using an ion gun punch-through process known in the art. The size of the pin hole 70 is determined at least in part by controlling current intensity of the ion gun. The isotropic etch performed on the etchable material 54 to open the top chamber 60 leaves etchable material 54 portions 72 which assist in controlling the formation of the pin hole 70 with the desired size. In a preferred implementation, the diameter d1 of the nanometric pin hole 70 is on the order of 1-100 nm. For use in a biological cell application, the pin hole 70 may have a micrometric diameter on the order of about 1 μm.

Figure 15:
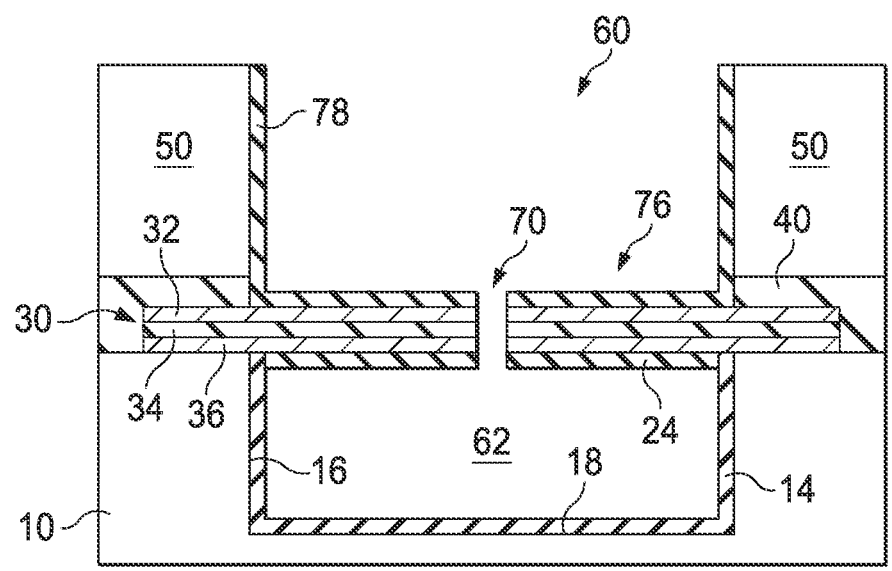

FIG. 15 illustrates the removal of the etchable material 54 portions 72. This is preferably accomplished using a desired etch which stops on the sacrificial Nblock material so as to form an elastic membrane (diaphragm) 76 including the pin hole 70. The elastic membrane may comprise a stack film such as SiO$_2$/Si$_3$N$_4$/SiO$_2$. The removed portions 72 may, in one implementation, be replaced with a protective liner 78 for the side walls of the top chamber 60 of, for example, silicon nitride.

Figure 16:
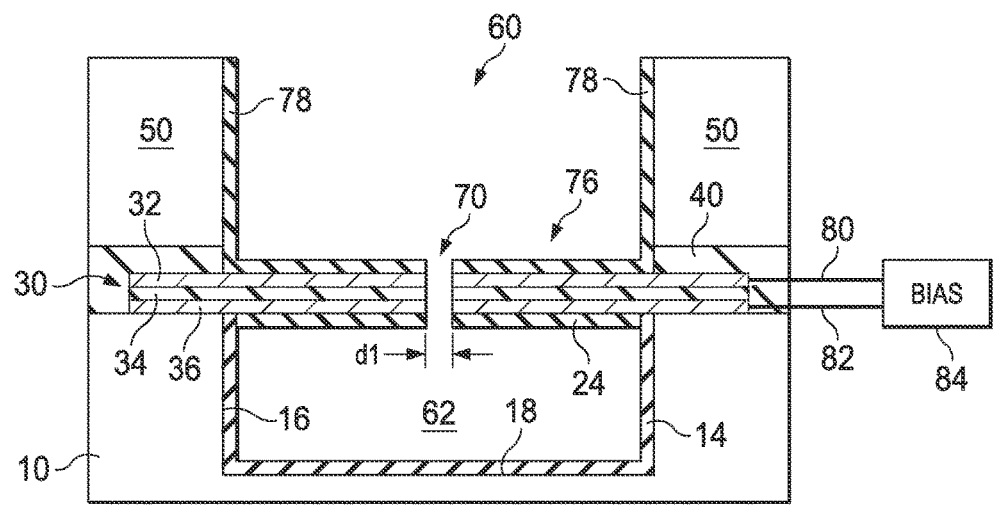
FIG. 16 illustrates the connection of biasing electric conductors for controlling operation of the nanometric structure.

FIG. 16 illustrates the resulting device 100. The device includes a support structure formed primarily by the substrate 10 and the substrate 50 along with encapsulating layer 40. An internal cavity within the support structure is divided into the top chamber 60 and the bottom chamber 62 by the presence of the elastic membrane 76. The elastic membrane is formed by the film stack 30 to include bottom electrode film 32, insulating film 34 and top electrode film 36. The pin hole 70, having a natural diameter d1, is formed to extend through the elastic membrane 76 and interconnect the top chamber 60 to the bottom chamber 62. The pin hole 72 is preferably centered, from side to side, with respect to the internal cavity within the support structure.

FIG. 16 further schematically illustrates the making of electrical connections 80 and 82 to the bottom electrode film 32 and top electrode film 36, respectively, of the film stack 30. These electrical connections can be made using any suitable microelectronic interconnection technique including the formation of metallizations and vias. The electrical connections 80 and 82 are coupled to a bias current supply 84.

Figure 17:
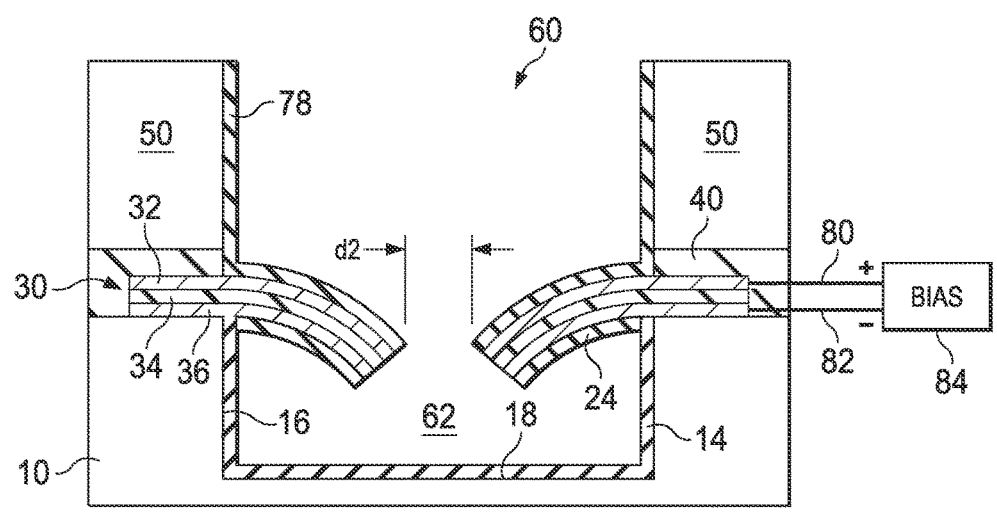
FIGS. 17 and 18 illustrate operation of the nanometric structure to support a modulated opening size in response to bias supply.

When no bias current is applied to the electrical connections 80 and 82, the pin hole 70 has a diameter d1. When a bias current is applied to the electrical connections 80 and 82, this causes the film stack 30 and elastic membrane 76 to bend or deform and produce an increase in the diameter of the pin hole 70. Thus, application of a bias current to the electrical connections 80 and 82 permits modulation of diameter of the pin hole 70. For example, as shown in FIG. 17, the application of the bias current to the electrical connections 80 and 82 causes the size of the pin hole 70 to increase to a diameter d2 (wherein the change in size is correlated to the applied magnitude of the bias current).

Figure 18:
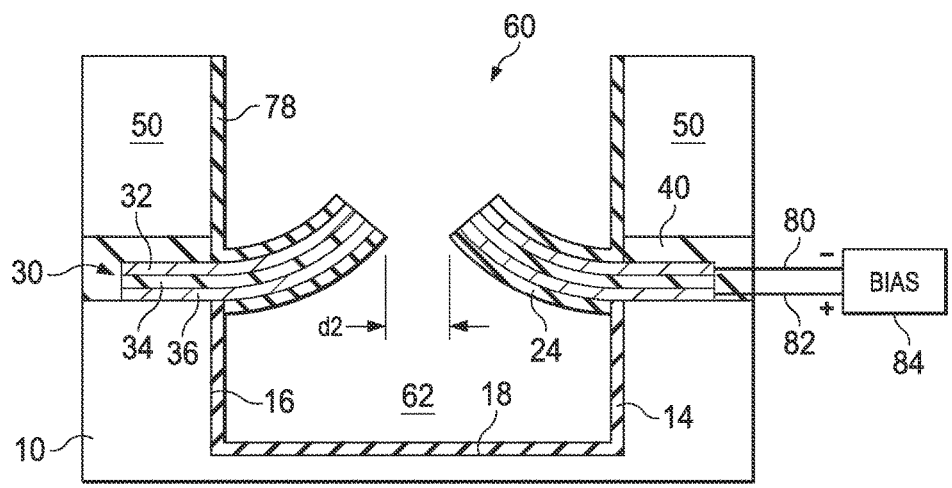

The polarity of the applied bias current selects the direction of opening that is associated with the diameter size change. FIG. 17 shows, with the application of a first polarity of bias current, that the film stack 30 bends in a direction towards the bottom chamber 62. Conversely, FIG. 18 shows, with the application of a second (opposite) polarity of bias current, that the film stack 30 bends in an opposite direction towards the top chamber 60.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
    forming a trench in a first substrate;
    filling the trench with a first etchable material;
    forming a membrane supported by said first substrate and extending over the first etchable material in said trench;
    forming a second substrate over the membrane;
    forming an opening in the second substrate;
    filling the opening in the second substrate with a second etchable material;
    isotropically etching the second etchable material to form a mask opening that exposes a portion of a top surface of the membrane;
    etching the first etchable material to form a cavity exposing a bottom surface of the membrane; and
    using the mask opening to form a pin hole extending through the membrane to said cavity.

2. The method of claim 1, wherein using the mask opening to form the pin hole comprises performing an ion gun punch-through process.

3. The method of claim 1, wherein forming the membrane comprises forming a first electrode film and a second electrode film separated by an insulating film.

4. The method of claim 1, further comprising removing any remaining second etchable material to define a chamber exposing the top surface of the membrane.

5. The method of claim 1, wherein a diameter of the pin hole is larger than 1 nm.

6. The method of claim 5, wherein the diameter of the pin hole is not larger than 100 nm.

7. The method of claim 1, wherein a diameter of the pin hole is about 1 µm.

8. A method, comprising:
    forming an opening in a first substrate;
    filling the opening in the first substrate with a first etchable material;
    forming a membrane including a first electrode film and a second electrode film separated by an insulating film to extend over the filled opening in the first substrate;
    forming a second substrate over the membrane;
    forming an opening in the second substrate;
    filling the opening in the second substrate with a second etchable material;
    etching the second etchable material to expose a top surface of the membrane;
    punching a pin hole through the membrane; and
    removing the first and second etchable materials to define a first chamber exposing a top surface of the membrane and a second chamber exposing a bottom surface of the membrane.

9. The method of claim 8, further comprising lining the opening in the first substrate with a protective layer that surrounds the first chamber.

10. The method of claim 9, further comprising lining the second chamber with a protective layer.

11. The method of claim 8, further comprising applying a bias current to the first and second electrode films, wherein the membrane is configured to respond to the application of the bias current to the first and second electrode films by bending to increase a diameter of the pin hole.

12. The method of claim 8, further comprising applying a bias current to the first and second electrode films, wherein the membrane is further configured to respond to application of a polarity of the bias current to the first and second electrode films by bending in a direction towards the first chamber.

13. The method of claim 8, further comprising applying a bias current to the first and second electrode films, wherein the membrane is further configured to respond to application of a polarity of the bias current to the first and second electrode films by bending in a direction towards the second chamber.

14. The method of claim 8, wherein a diameter of the pin hole is larger than 1 nm.

15. The method of claim 14, wherein the diameter of the pin hole is not larger than 100 nm.

16. The method of claim 8, wherein a diameter of the pin hole is about 1 µm.

17. The method of claim 8, wherein the first and second electrode films include platinum and the insulating film includes a piezo material.

18. The method of claim 8, wherein etching the second etchable material comprises performing an isotropic etch to expose a portion of the top surface of the elastic membrane at the location of the pin hole.

19. A method, comprising:
    forming a first opening in a first substrate;
    forming a diaphragm made of a first conductive film and a second conductive film separated by an insulating film, said diaphragm having a bottom surface extending over the first opening in the first substrate;
    forming a second substrate over a top surface of the diaphragm;
    forming a second opening in the second substrate;
    filling the second opening in the second substrate with an etchable material; and
    isotropically etching the etchable material to form a mask opening which exposes the top surface of the diaphragm; and
    punching a pin hole through the diaphragm using the mask opening to locate the pin hole.

20. The method of claim 19, further comprising removing remaining etchable material to form a cavity over the diaphragm.

21. The method of claim 19, further comprising filling the first opening with an etchable material, said etchable material in the first opening supporting the diaphragm.

22. The method of claim 21, further comprising removing the etchable material from the first opening to form a cavity underneath the diaphragm.

23. The method of claim 19, wherein a diameter of the pin hole is not larger than 100 nm.

24. The method of claim 19, wherein a diameter of the pin hole is about 1 μm.

25. The method of claim 19, punching comprises performing an ion gun punch-through process.

* * * * *